United States Patent [19]

Chang et al.

[11] Patent Number: 5,028,549
[45] Date of Patent: Jul. 2, 1991

[54] ETCHED BACK EDGE ISOLATION PROCESS FOR HETEROJUNCTION BIPOLAR TRANSISTORS

[75] Inventors: Mau-Chung F. Chang, Thousand Oaks; Peter M. Asbeck, Newbury Park, both of Calif.

[73] Assignee: Rockwell International, El Segundo, Calif.

[21] Appl. No.: 335,477

[22] Filed: Apr. 10, 1989

[51] Int. Cl.$^5$ .......................................... H01L 21/265
[52] U.S. Cl. ....................................... 437/24; 437/16; 437/67; 437/33; 437/203; 437/31; 148/DIG. 10; 148/DIG. 100; 148/DIG. 103
[58] Field of Search ................ 437/16, 24, 67, 33, 437/203, 31; 148/DIG. 11 H, DIG. 10

[56] References Cited

U.S. PATENT DOCUMENTS

| | | | |
|---|---|---|---|
| 4,326,911 | 4/1982 | Howard | 156/643 |
| 4,731,340 | 3/1988 | Chang | 437/31 |
| 4,732,871 | 3/1988 | Buchmann | 156/633 |
| 4,742,026 | 5/1988 | Vatus | 437/245 |
| 4,751,195 | 6/1988 | Kawai | 437/31 |
| 4,818,712 | 4/1989 | Tully | 437/26 |
| 4,824,805 | 4/1989 | Kajikawa | 437/31 |

OTHER PUBLICATIONS

Howes, M. J. Morgan Div.; *Gallium Arsenide, Materials Devices and Circuits*; John Wiley and Sons, 1985, pp. 156–157, 276–279.
"Low Temperature Photo-CVD Oxide Processing for Semiconductor Device Applications," J. W. Peters; IEDM Processings, Washington, D.C. (1981)

*Primary Examiner*—Brian E. Hearn
*Assistant Examiner*—Anthony Gutierrez
*Attorney, Agent, or Firm*—Craig O. Malin; H. Fredrick Hamann

[57] ABSTRACT

A method of isolating individual heterojunction bipolar transistors (HBTs) on a wafer increases the current gain which can be obtained when using proton implantation to isolate the transistor. The photoresist pattern which is used to cover the transistor location during isolation implantation is undercut when etching the cap layer. A dielectric is then deposited on the etched surface, including the undercut portion. The photoresist is lifted off and an HBT is fabricated on the wafer in the area which is not covered by the dielectric. The dielectric on the undercut portion confines the emitter current to a region slightly removed from the isolation implant and provides improved current gain.

4 Claims, 2 Drawing Sheets

ETCHED BACK EDGE ISOLATION PROCESS FOR HETEROJUNCTION BIPOLAR TRANSISTORS

STATEMENT OF GOVERNMENT INTEREST

The Government has rights in this invention pursuant to Contract No. F33615-85-C-1749 awarded by the Air Force.

BACKGROUND OF THE INVENTION

This invention relates to the field of solid state electronics and particularly to a process for making heterojunction bipolar transistors (HBTs) on a semiconductor wafer.

HBTs are fabricated on wafers having a layered structure which forms the heterojunction(s) and the p-n junctions of the transistor. This layered structure is produced during growth of the wafer using processes such as molecular beam epitaxy (MBE) and metal organic chemical vapor deposition (MOCVD).

In order to provide an integrated circuit incorporating the HBTs, it is necessary to isolate the individual HBTs from each other and from other devices on the wafer. In order to provide high fan-out, low power, and high accuracy HBT integrated circuits, it is necessary to use isolation processes which do not greatly reduce the current gain of the transducers. A process which has proven useful to isolate individual circuit elements is the implantation of protons in the material surrounding the circuit element. However, the isolation implant reduces the current gain of the HBT, and there is a continuing need to improve the process and minimize the reduction in current gain caused by the isolation implant.

SUMMARY OF THE INVENTION

It is an object of the invention to provide an improved process for isolating HBTs in integrated circuits.

It is an object of the invention to provide HBTs having a high current gain in an integrated circuit.

According to the invention, a photoresist pattern is formed on the cap layer of a heterojunction bipolar semiconductor wafer. The photoresist covers the locations for the HBTs and any other locations which need protection from the isolation implantation. Protons are then implanted into uncovered portions of the wafer to isolate the HBTs from the rest of the wafer.

The cap layer is etched away using the existing photoresist layer to protect and to retain the cap layer in the HBT locations. However, an etching process is used which undercuts the periphery of the photoresist pattern. This is an important step in the process because it allows dielectric to be deposited in an edge around the HBT location which has not been damaged by the isolation implant. A dielectric such as $SiO_2$ or $Si_3N_4$ is then deposited on the etched and the undercut portions of the wafer.

The photoresist and its overlying dielectric is lifted off, thus leaving HBT locations on the wafer which are covered with a cap layer, but are not covered by dielectric. Because the photoresist was undercut during etching, these HBT locations are spaced a short distance from material which has been damaged by the isolation implant. The transistor (emitter, base, and collector) are fabricated in these locations using prior art processes.

The dielectric, which surrounds the HBT on the surface of the wafer, confines the emitter current to semiconductor material which is slightly removed from the implant-damaged material. HBTs made according to the invention had significantly higher current gains than similar HBTs which were not spaced away from the isolation implanted material.

DESCRIPTION OF THE PREFERRED EMBODIMENT

Figure 1:
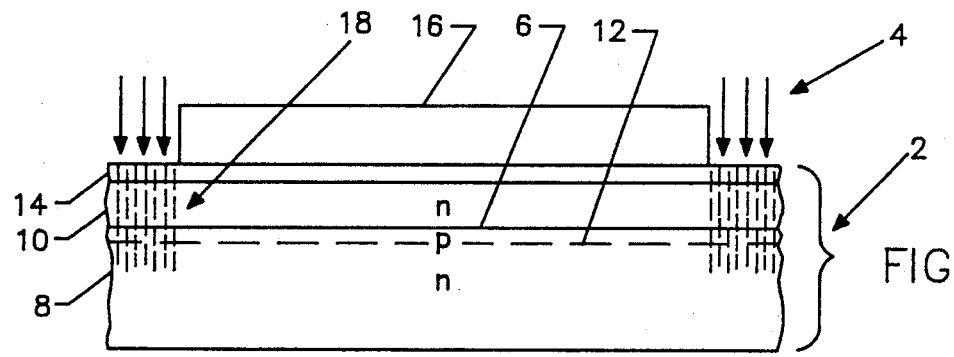
FIGS. 1–5 illustrate steps in the process of fabricating a heterojunction bipolar transistor (HBT) according to the invention.

FIG. 1 shows a heterojunction bipolar wafer 2 being subjected to a proton implantation process 4. Wafer 2 has a single heterojunction 6 between GaAs 8 and AlGaAs 10. Because GaAs 8 has p-type conductivity and the adjacent AlGaAs 10 has n-type conductivity, heterojunction 6 is also a p-n junction. A second p-n junction 12 is formed below heterojunction 6 by appropriate doping of GaAs 8. Such a heterojunction bipolar wafer 2 can be formed using known growth technologies such as molecular beam epitaxy (MBE) or metal organic chemical vapor deposition (MOCVD). Cap layer 14 is formed on top of wafer 2 to facilitate making ohmic contact to an emitter. Cap 14 is a thin layer of $n^+$-type conductivity material such as GaAs or InAs as is known in the prior art.

Photoresist pattern 16 is formed on cap 14 to define the location of an individual HBT on the wafer. It shields this location from proton implantation 4 which is used to provide electrical isolation of the HBT. The term proton is used to include sources such as H, He, B, and $O_2$. The protons create a zone 18 of damaged material around the HBT location. Its depth within wafer 2 is determined by the energy used to implant the protons, as is known in art.

Figure 2:
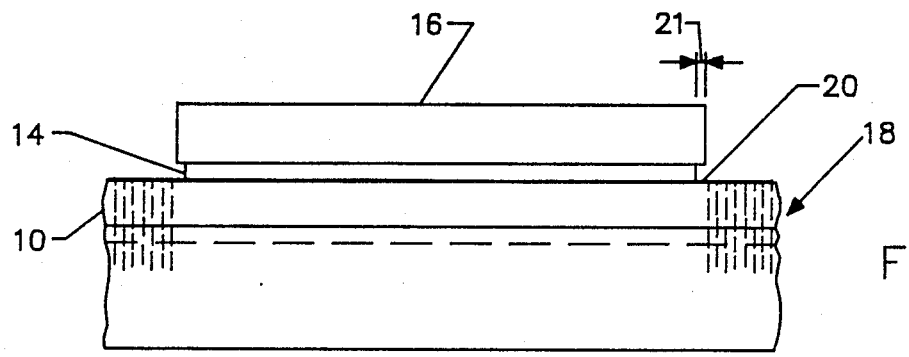

FIG. 2 shows the wafer after cap layer 14 has been etched off in these areas which have not been protected by photoresist pattern 16. This etching step is a self-aligned process because it uses the same photoresist pattern 16 which was used to locate isolation implant 4. A selective etchant is used which stops after reaching the AlGaAs layer 10 below cap layer 14. The etchant is also capable of undercutting photoresist 16 adjacent its periphery. This leaves an exposed rim or edge 20 of the wafer which has not been damaged by proton implant 16. Edge 20 completely surrounds the HBT location. In the example shown in FIG. 2, the edge 20 of undamaged material is spaced a distance 21 of about 0.3 um from implanted zone 18.

Reactive ion etching (RIE) has been used as the selective etchant to remove cap layer 14 and undercut photoresist 16. This is a prior art dry etching technique in which the material to be etched is exposed to a plasma which can then react with and etch the material. In this example, the cap was removed and the photoresist was undercut using a $CCl_2F_2/He_2$ plasma in a reactive ion etching process. However, other etchants which etch only the cap layer and which undercut the photoresist can be used.

Figure 3:
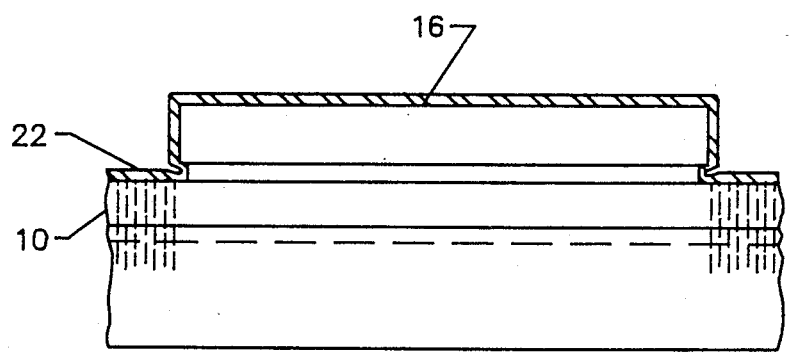

After etching the exposed cap layer and undercutting the photoresist, a dielectric 22 is deposited over layer 10 as shown in FIG. 3. This is also a self-aligned process because existing photoresist pattern 16 is used to define the location of dielectric 22 on wafer 2. Photo-CVD (chemical vapor deposited) SiO$_2$ deposited at 75° C. has been used to deposit SiO$_2$ dielectric 22. Other dielectrics such as Si$_3$N$_4$ and other processes for depositing dielectrics can be used.

Figure 4:
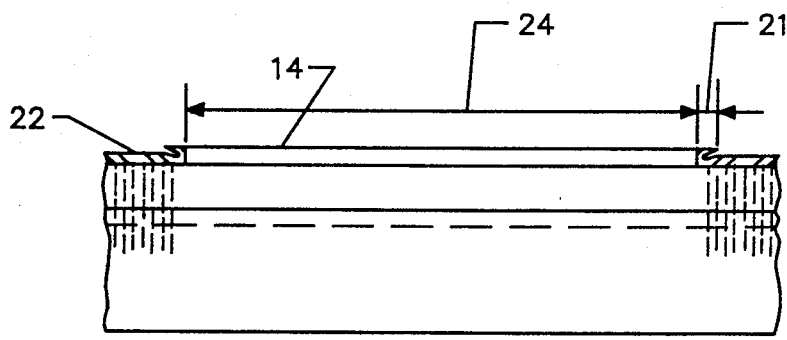
Figure 5:
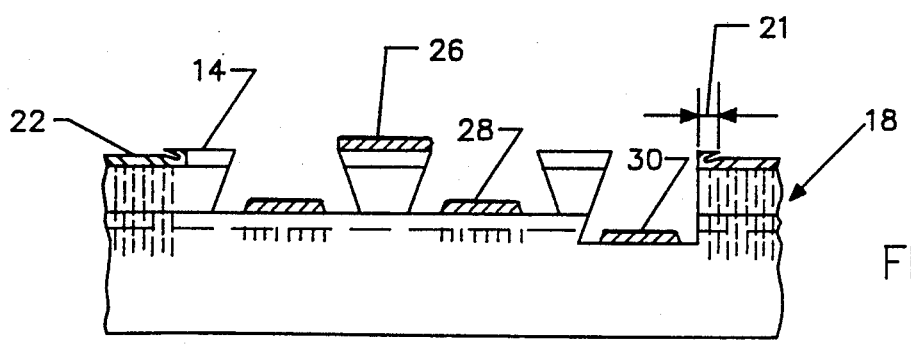

Photoresist 16 with its overlying dielectric 22 is lifted off the wafer. This leaves cap layer 14 covering HBT location 24 and dielectric 22 covering the rest of the wafer as shown in FIG. 4. The invention has now prepared the wafer so that it is ready to be processed into a HBT in accordance with prior art or other techniques. This involves additional photoresist patterning, etching, and metal deposition to form an emitter 26, base 28, and collector 30 on suitable layers of the wafer, as shown in FIG. 5. See for example "AlGaAs/GaAs Heterojunction Bipolar Transistor Circuits with Improved High-Speed Performance" by M-C F. Chang et al in ELECTRONICS LETTERS 23 Oct 1986, Vol. 22, No. 22, pp. 1173–1174.

Figure 6:
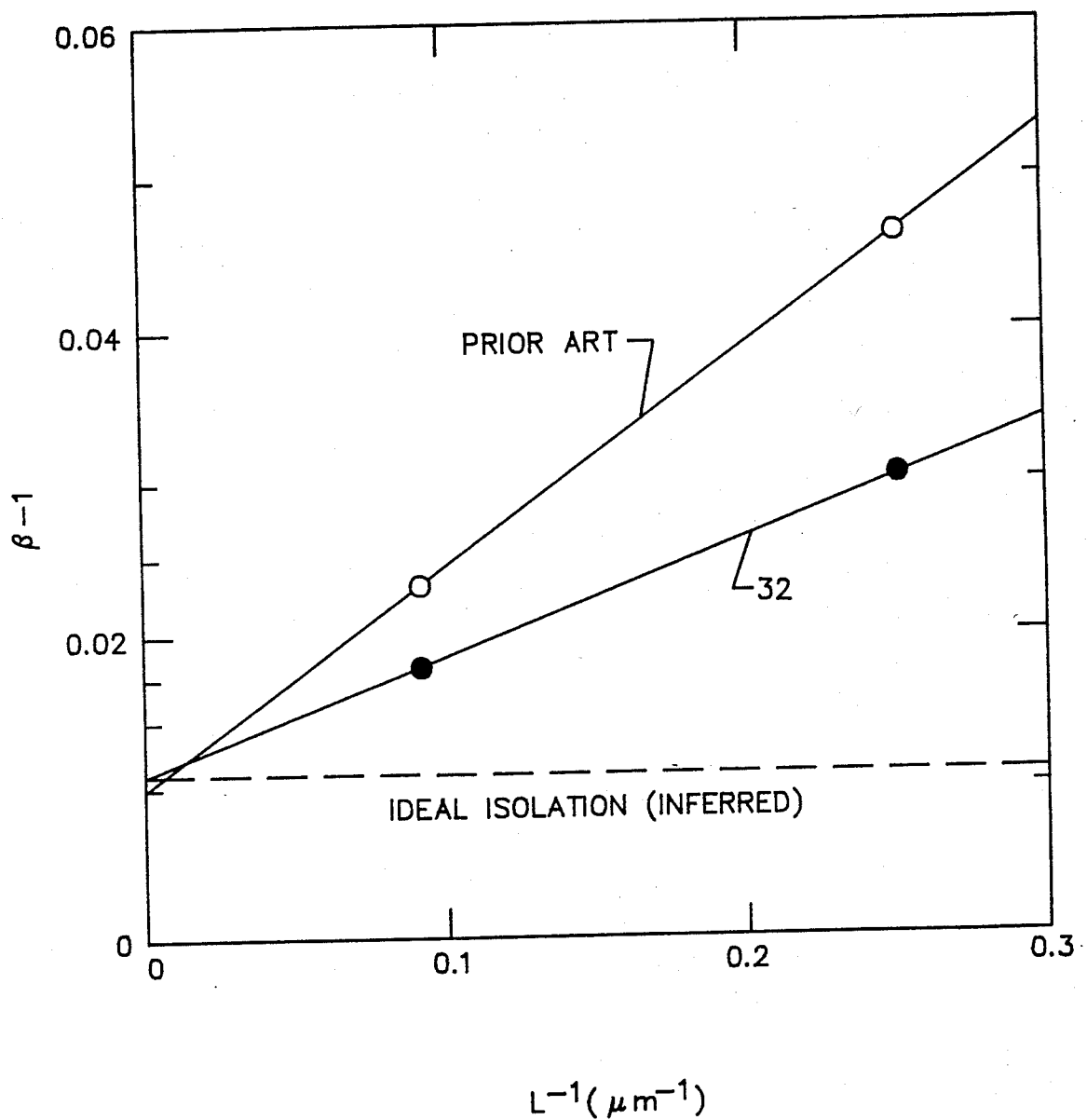
FIG. 6 is a graph comparing the current gain of HBTs produced according to the prior art with the current gain of HBTs produced according to the invention.

In HBTs made according to the invention, the emitter current is confined to a region slightly removed from the implant damaged area. Consequently, they have higher current gains than comparable prior art HBTs which do not have such separation. This is shown in FIG. 6 which is a plot of the evident current gain, beta, vs emitter length, L, (both plotted as reciprocals). HBTs made according to the invention with etched-back edge isolation (curve 32) had higher current gain than the prior art HBTs. The higher current gain obtainable by this invention is particularly useful for HBTs used in analog/digital applications and in digital circuits.

Numerous variations can be made without departing from the invention. Group III-V semiconductor compounds other than GaAs can be used. Double heterojunction structures can be used and either p-n-p or n-p-n bipolar transistors can be fabricated. Accordingly, it should be understood that the form of the invention described above is illustrative and is not intended to limit the scope of the invention.

What is claimed is:

1. A method for isolating a heterojunction bipolar transistor (HBT) on a semiconductor wafer, comprising:
   providing a heterojunction bipolar semiconductor wafer having a cap layer;
   forming a photoresist pattern on the cap layer comprising photoresist which covers a location for an HBT on the wafer;
   implanting protons into the uncovered portion of the wafer to isolate the HBT location from the rest of the wafer;
   etching the uncovered cap layer and the portion of the covered cap layer adjacent to the periphery of the photoresist to undercut the photoresist and to provide a mesa cap for the HBT;
   depositing dielectric on the etched and the undercut portions of the wafer;
   lifting off the photoresist and its overlying dielectric; and
   providing an emitter, base, and collector for the HBT within the portion of the wafer that is not covered by the dielectric, whereby the pheripheral edge of the HBT is spaced from the isolation implanted area of the wafer.

2. The method as claimed in claim 1 wherein the step of depositing dielectric comprises depositing photo-CVD SiO$_2$ at a temperature of about 75° C.

3. The method as claimed in claim 1 wherein the step of depositing dielectric comprises depositing Si$_3$N$_4$.

4. The method as claimed in claim 1 wherein the step of etching the cap layer comprises reactive ion etching the cap layer using a CCl$_2$Fl$_2$/He$_2$ plasma.

* * * * *